(12) United States Patent
Noort et al.

(10) Patent No.: US 7,989,875 B2
(45) Date of Patent: Aug. 2, 2011

(54) BICMOS INTEGRATION OF MULTIPLE-TIMES-PROGRAMMABLE NON-VOLATILE MEMORIES

(75) Inventors: Wibo Van Noort, Westbrook, ME (US); Theodore James Letavic, Putnam Valley, NY (US); Francis Zaato, Fishkill, NY (US); Charudatta Mandhare, Fishkill, NY (US)

(73) Assignee: NXP B.V., Eindhoven (NL)

( * ) Notice: Subject to any disclaimer, the term of this patent is extended or adjusted under 35 U.S.C. 154(b) by 327 days.

(21) Appl. No.: 12/277,102

(22) Filed: Nov. 24, 2008

(65) Prior Publication Data

US 2010/0127318 A1    May 27, 2010

(51) Int. Cl.
*H01L 29/788* (2006.01)
(52) U.S. Cl. ............... 257/318; 257/E21.422; 257/315
(58) Field of Classification Search ............... 257/314, 257/315, E21.422, 318
See application file for complete search history.

(56) References Cited

U.S. PATENT DOCUMENTS

| | | | | |
|---|---|---|---|---|
| 5,198,691 A * | 3/1993 | Tarng | ............................. | 257/316 |
| 5,872,378 A * | 2/1999 | Rose et al. | ..................... | 257/355 |
| 5,953,600 A | 9/1999 | Gris | | |
| 5,969,992 A * | 10/1999 | Mehta et al. | ............. | 365/185.28 |
| 6,028,789 A * | 2/2000 | Mehta et al. | ............. | 365/185.14 |
| 6,066,521 A | 5/2000 | Yokoyama et al. | | |
| 6,875,648 B1 | 4/2005 | Chaudhry | | |
| 7,508,027 B2 * | 3/2009 | Oberhuber et al. | ........... | 257/318 |
| 7,593,261 B2 * | 9/2009 | Park et al. | ................ | 365/185.05 |
| 7,746,696 B1 * | 6/2010 | Paak | ......................... | 365/185.08 |
| 7,821,054 B2 * | 10/2010 | Watanabe | ....................... | 257/315 |
| 7,868,372 B2 * | 1/2011 | Chen et al. | ..................... | 257/315 |
| 2005/0074935 A1 * | 4/2005 | Hsu | ................................ | 438/200 |
| 2005/0179111 A1 * | 8/2005 | Chao | ............................. | 257/510 |
| 2007/0064488 A1 * | 3/2007 | Tanaka | ..................... | 365/185.18 |
| 2007/0235816 A1 | 10/2007 | Moore | | |
| 2007/0241387 A1 * | 10/2007 | Onoda | ......................... | 257/314 |

FOREIGN PATENT DOCUMENTS

| | | |
|---|---|---|
| EP | 0 529 860 A2 | 3/1993 |
| JP | 2007-194266 | 8/2007 |
| WO | 2006/127200 A1 | 11/2006 |

OTHER PUBLICATIONS

PCT/IB2009/055304 International Search Report, Mar. 2, 2010.

* cited by examiner

*Primary Examiner* — Jerome Jackson, Jr.
*Assistant Examiner* — Paul A Budd

(57) ABSTRACT

A BiCMOS substrate includes a bipolar area having a buried carrier layer, and a deep trench isolation (DTI) trench extending into the buried carrier layer to form a surface well implant above a buried well implant within the DTI trench, the buried well implant being the buried carrier layer portion within the DTI trench. A floating gate is disposed on the carrier well. Optionally, a high voltage control gate is formed of a stack of the buried well implant and the surface well implant within the DTI trench. Optionally, a poly layer formed of a bipolar process base poly layer is disposed on the floating gate. Optionally, a shallow well isolation region is formed on the substrate, a floating gate is disposed on the shallow well region, and an overlaying control gate, formed of a bipolar process base poly, is disposed above the floating gate.

17 Claims, 4 Drawing Sheets

BICMOS INTEGRATION OF MULTIPLE-TIMES-PROGRAMMABLE NON-VOLATILE MEMORIES

TECHNICAL FIELD

Embodiments relate generally to multiple-times programmable non-volatile memories.

BACKGROUND

Multiple times programmable (MTP) memory circuits are a particular kind of semiconductor non-volatile memory (NVM), providing re-programmable storage of data, with long retention, without need for refresh or application of power.

MTP memory circuits typically comprise a plurality of cells, each cell typically storing one bit of binary information. MTP cells storing more than one bit of information, sometimes referred to as "multi-level" MTPs, are known. Further detailed discussion of these is omitted, because concepts and features of the present invention may be applied to multi-level MTPs by persons of ordinary skill in the art based on this disclosure.

MTP cells are often fabricated on the same substrate as other circuitry such as, for example, analog filters, to provide local storage of, for example, amplifier gain and phase adjustment values, and to store identification data such as, for example, radio frequency identification device (RFID) parameters.

MTPs are designed and fabricated to meet a plurality of design goals. Example goals include data retention, convenience in programming, storage capacity, density, power consumption, and manufacturing cost. Some of these goals interrelate with one another. For example, density relates to storage capacity. Some of these goals may be measured by various different metrics. For example, manufacturing cost may include a count of the number of added processing steps, meaning steps not common with any step performed in fabricating any non-MTP circuitry. Manufacturing cost may include a decrease in chip yield arising from, for example, process faults within the MTP cells. Manufacturing cost may be based, in part, on the commonality (or lack of commonality) of processing steps forming the MTP cells with processing steps forming other circuit components.

As known with MTPs, for certain ones of these design goals, optimization with respect to one goal may be detrimental with respect to one or more of the other goals.

For example, conventional electrically erasable programmable memory (EEPROM), have functionality that overlaps with MTP but generally provide larger capacity. However, EEPROM typically requires numerous extra processing steps. Further, semiconductor system forming, on a common substrate, CMOS devices and bipolar devices, are being employed in increasing numbers, over an increasing range of applications. BiCMOS processing, though, has particular issues that often magnify the cost of added fabrication steps. Conventional EEPROM processing, in addition to requiring many steps, requires steps that are typically not included in conventional BiCMOS processing.

SUMMARY

The present invention provides, among other features and benefits, a high retention MTP, having a structure enabling ready fabrication using conventional steps of a conventional BiCMOS process, requiring minimal added process steps, and requiring minimal processing parameters particular to the MTP circuitry.

The present invention provides better breakdown voltage for diffused control gates, which allows more flexibility in floating gate design, and provides for higher charge storage. A higher breakdown voltage of the control gate structure provides features and benefits including, for example, more circuit flexibility in the combination program voltage and program time. These and other benefits further provide features and benefits including, for example, improved retention time, higher number of read cycles, and improved data retention at higher temperatures.

According to one illustrative example of one BiCMOS system according to one embodiment, the system comprises a semiconductor substrate supporting CMOS devices and bipolar devices, and has at least one area for forming an MTP according to a first embodiment. In one example, an MTP cell may include a deep trench isolation (DTI) isolated control gate formed of a first surface well implant above a first buried well implant, with the first surface well implant and the first buried well implant bounded by, and abutting inward facing surfaces of a first deep trench isolation (DTI) trench surrounding a given region of the substrate, the first DTI trench extending a depth D1 into substrate, the first buried well implant being at a depth less than D1. The first buried well implant may be a cut-out portion of a larger area buried implant layer, after being cut out and separated from the larger buried implant layer by the vertical walls of the first DTI trench.

The DTI isolated control gate arranged according to this embodiment, due to features including the inner face of the first DTI trench surrounding the perimeter of the first buried well implant and surrounding the first surface well implant above the first buried well implant provides a substantially increased breakdown voltage for the control gate diffused junction.

Further, one example may include a first floating gate disposed on an upper surface of the first surface well implant, and a second floating gate, electrically connected to the first floating gate, disposed on an area of the upper surface of the substrate outside the first surface well implant. In one example, the first floating gate and the second floating gate are arranged and dimensioned to selectively form a channel through the first surface well implant, in response to given charge state of first and second floating gate.

In one example of MOS MTP according to this embodiment, all of the structural elements are formed by processing steps that may consist of a combination of processing steps employed in forming CMOS devices of the BiCMOS system and processing steps employed in forming bipolar devices of BiCMOS system.

According to one illustrative example, a method comprises providing a substrate, forming a buried implant layer having an upper surface extending at a depth D under a top surface of the substrate, and forming a MOS MTP cell in a given MTP area above the buried implant layer, within the bipolar area. In one example, the forming of the MOS MTP cell includes forming a DTI isolated control gate as a vertical stack of a first surface well implant above a first buried well implant, surrounded by a first DTI trench, by forming a first DTI trench extending a depth D1 into the substrate, into the buried implant layer, to form the first surface well implant as the portion of the substrate within the inner facing walls of the first DTI trench, overlaying the portion of the buried implant layer extending to and abutting the inward facing surfaces of the DTI trench, that portion being cut out from and separated from the remaining region of the buried implant layer by the vertical calls of the DTI trench. Further, one example may include forming a first floating gate on an upper surface of the DTI insulated control gate, i.e., an upper surface of the first surface well implant, and a forming a second floating gate, electrically connected to the first floating gate, on an area of the upper surface of the substrate outside the first surface well implant. As will be understood by persons of ordinary skill in the art upon reading this disclosure, the area ratio of the first and second floating gate regions defines what is known in the art as the voltage coupling parameter of the MTP cell.

According to one illustrative example of one BiCMOS system according to one embodiment, the system comprises a semiconductor substrate supporting CMOS devices and bipolar devices, and has at least one area for forming an MTP according to a first embodiment. In one example, the MTP cell comprises a DTI isolated surface well implant within the substrate, formed by inward facing surfaces of a DTI trench surrounding a given region of the substrate, and a shallow isolation well, adjacent the DTI surface well implant, having an upper surface at an upper surface the substrate. In one example, the MTP cell further comprises a first floating gate disposed on the upper surface of the shallow isolation well, a second floating gate, electrically connected to the first floating gate, disposed on an area of the upper surface of the DTI insulated surface well implant, and a control gate disposed on a top surface of the first floating gate. Further, in one example the first floating gate and the second floating gate are arranged and dimensioned to selectively form a channel through the DTI insulated surface well implant in response to given charge state of the first and second floating gate.

Benefits of MOS MTP cells according to this embodiment include elimination of an active layer under the floating gate storage conductor, which significantly reduces charge leakage, and increases retention.

The above-summarized advances and features of the invention are only examples of those provided by the various exemplary embodiments, and are not intended to be exhaustive or limiting of the possible advantages that may be realized.

These and other advantages of the various exemplary embodiments will be apparent from the description herein, and can be learned from practicing systems and method including one or more of the various exemplary embodiments, both as illustrated and specifically described herein and as modified in view of any variation that becomes apparent to those skilled in the art.

Figure 1:
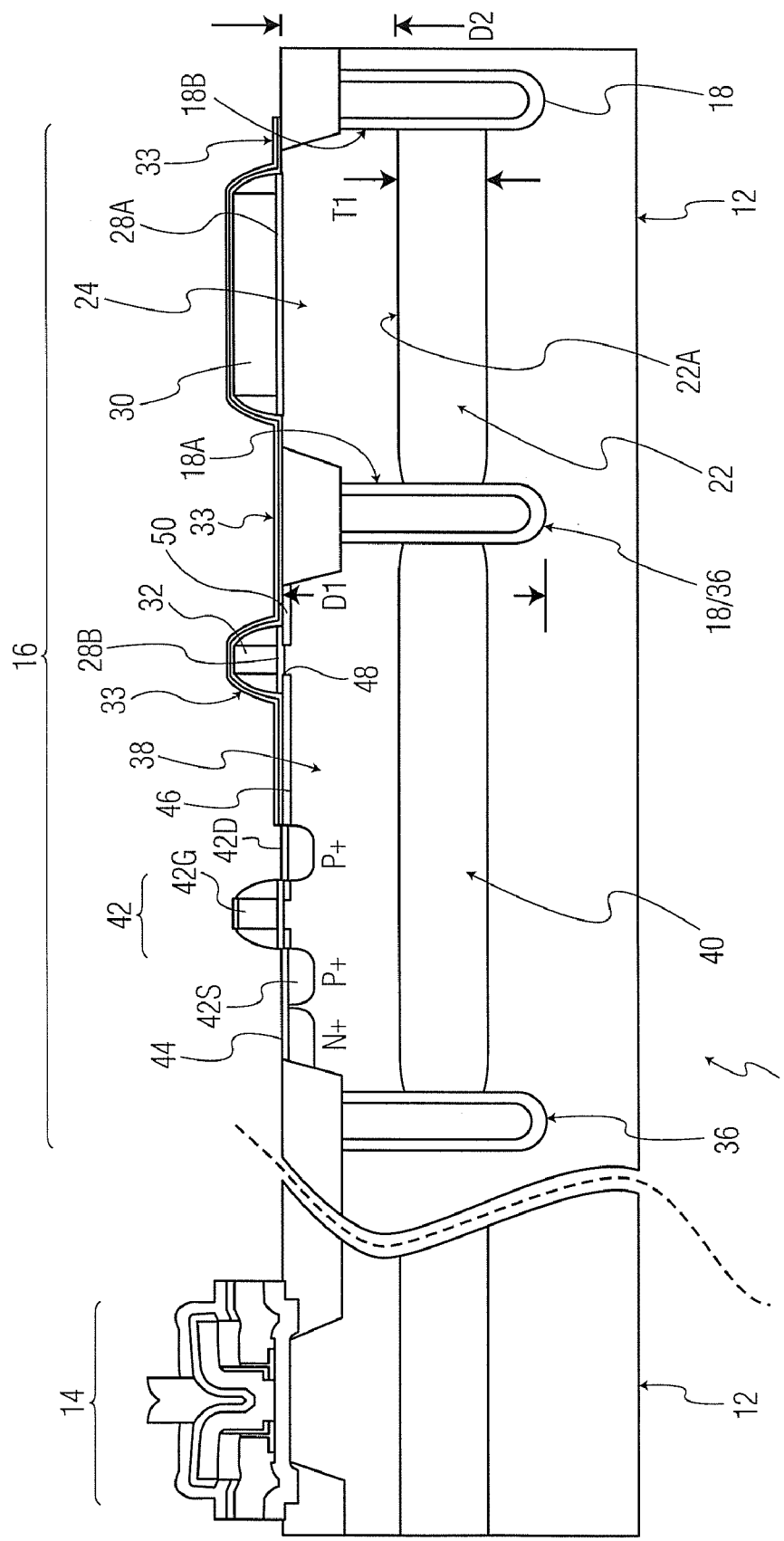
FIG. 1 shows a schematic cross-section of one example BiCMOS system having one example MOS MTP cell according to a first embodiment.

It will be appreciated by persons of ordinary skill in the art that, for clarity of illustration, figures may not be drawn to scale. For example, as will be readily apparent to such persons, graphical depiction of certain proportional relationships of shape, dimension and position among various structural features may be exaggerated with respect to actual physical proportions.

DETAILED DESCRIPTION

Various exemplary embodiments and illustrative examples of each for practicing the invention are described. To avoid obscuring novel features and aspects, and to readily provide persons skilled in the relevant arts a complete understanding of the invention, the description may omit various details of methods and techniques known to such persons which, upon reading this description, will be readily identifiable by such persons as applicable in practicing the claimed invention.

It will be understood that the particular examples are only for facilitating an understanding of the invention by way of illustrative example. Embodiments of the invention are not limited to the specific examples described. Other configurations and arrangements can, upon reading this description, be readily recognized and implemented by persons skilled in the relevant arts.

Various embodiments and aspects may be described separately and/or as having certain differences. Separate description, and/or description of certain differences, however, does not necessarily mean the respective embodiments are mutually exclusive. For example, a particular feature, function, or characteristic described in relation to one embodiment may be included in, or adapted for other embodiments.

The description refers to accompanying drawings, which form a part of this description. For clarity and minimal duplicative description, functional blocks or items that are, or may be, identical or substantially identical between the different drawings, whether of the same or different embodiments, may be identified with like numerals. However, unless otherwise stated or made clear from a particular context, different numerals appearing in different drawings do not mean the respective functions or items cannot be functionally, or structurally identical.

Further, the order in which structures are described is not necessarily representative of the order of fabrication.

In the following description, the terms "vertical" and "horizontal" are only used as relative axes of reference, for describing depicted examples of structures in terms of their example orientations relative to example substrates, where "vertical" and "horizontal" are substantially orthogonal, and "vertical" means normal to the extending plane of the substrate, and "horizontal" means parallel to the extending plane.

One embodiment may include a conventional BiCMOS system, meaning a single substrate having a bipolar device area and a CMOS device area, having one or more areas or regions of the bipolar area designated as an MTP memory area. The single substrate may comprise a P-type material. In one example, the bipolar device area may have one or more buried N-type (BN) layers forming, for example, one or more buried collectors for vertical bipolar junction devices, and the CMOS region may be processed to have one or more buried P-type (BP) layers, and may be processed to have one or more BN layers, for forming various transistor body diffusions and/or low-ohmic contact to the substrate.

In one example, at a designated MTP memory area of a BiCMOS substrate, a MOS MTP cell according to a first embodiment is formed. In one example, the MTP memory area is preferably within an area having a buried BN layer, such as a typical bipolar area of a typical BiCMOS substrate.

In one example according to the first embodiment, an MTP cell is formed at an MTP cell area of the MTP memory area. At least a portion of the MTP cell area is above a buried BN layer, at a BN depth. This provides, in addition to circuit structural benefits, additional processing benefits including, for example, exploitation of buried BN layers being regularly formed in such bipolar areas as, for example, buried collector layers for vertical NPN devices.

In one example according to the first embodiment, a DTI isolated control gate is formed by a first DTI trench, extending a depth greater than the BN depth, surrounding a given area of the substrate to form the DTI isolated control gate as a stack, within the inward facing vertical wall of the first DTI trench, of a first surface implant well above a first buried implant well, where the first buried implant well may be a portion cut out and separated from the buried BN layer by the vertical walls of the first DTI trench. In one example, a second DTI trench forms a second surface well implant above a second buried well implant, which may be, but is not necessarily another portion of the buried BN layer from which the first DTI trench, in one example, formed the first buried implant layer. The first surface well implant may be, but is not necessarily, an n-well. The second surface well implant may be, but is not necessarily, an n-well. A portion of the first DTI trench may be common with a portion of the second DTI trench. The second surface well implant may be adjacent the first surface well implant.

This structure of the first DTI trench forming, in combination with a buried BN layer, a control gate having a vertical stack of a surface implant well over a buried implant well, the stack being surrounded by the first DTI trench, provides a substantially increased breakdown voltage for the control gate. As will be understood by persons of ordinary skill in the art based on this disclosure, the increased breakdown voltage is provided, in part, by this first DTI trench removing the cylindrical diffusion portion of the BN-to-substrate blocking junction that would exist (absent the vertical walls of the first DTI trench) between the lateral perimeter of both the first buried well implant and the first surface well implant and the surrounding substrate.

Further, this example structure of a MOS MTP cell according to the first embodiment, employing DTI trenches, provides processing benefits of exploiting DTI trenches being regularly formed in CMOS areas of BiCMOS systems. As known to persons of ordinary skill in the art, DTI trenches are formed in CMOS areas of BiCMOS systems bipolar areas for various purposes, including reducing a perimeter component of collector/substrate capacitances, which may affect circuit noise and oscillation frequencies of bipolar transistors. The first embodiment utilizes such DTI processing for forming MOS MTP cells.

In one example according to the first embodiment, the first DTI trench may extend along a given control gate perimeter, and preferably extends vertically to a depth greater than the BN depth, to form the control gate as the vertical arrangement, within the inner surfaces of the DTI trench wall, of a first surface well implant above a top surface of the portion of a buried BN layer, cut out from the buried BN layer by the DTI walls, that now extends to the inner facing wall of the first DTI trench.

In one example according to the first embodiment, the second DTI trench extends along a given perimeter of the second surface a poly layer formed of a bipolar process base poly well implant, and extends vertically to a depth greater than the BN depth, forming the second surface well implant above a second buried well implant, the second buried well implant being the portion of a buried BN layer cut off from the layer by the DTI trench.

In one example MOS MTP cell according to the first embodiment, a floating gate is formed having two sections, displaced from another, but electrically connected to maintain the same voltage potential. In one example, the floating gate comprises a floating gate storage section formed on the first surface well implant, and a floating gate sense section formed on the substrate outside of the first surface well implant. The floating gate storage section is therefore, in such an example, formed on the upper surface of the DTI isolated control gate. In one example, the floating gate sense section may be formed on an upper surface of the second surface well implant. The floating gate storage section may include a floating gate storage conducting layer disposed on a floating gate storage insulating layer which, in turn, is formed on an upper surface of the first surface well implant.

The floating gate sense section may include a floating gate sensing conductor layer, disposed on a floating gate sense section insulating layer that is formed on an upper surface of the DTI insulated control gate. In one example, the upper surface of the DTI insulated control gate is the upper surface of the first surface well implant.

The function of the control gate is to program the MOS MTP cell by charging, or discharging the floating gate. The charging and discharging is performed by placing a voltage potential on the control gate, with respect to the floating gate potential, of sufficient magnitude to form a Fowler-Nordheim (FN) tunnel current through the floating gate storage section insulating layer to the floating gate storage conducting layer. The direction or polarity of the programming voltage determines the direction of the current flow. The amount of charge that can be placed on the floating gate, on one hand, and the leakage rate on the other hand, determine, in significant part, the retention time of the MOS MTP cell.

In MOS MTP cells according to this embodiment, because the inward facing walls of the first DTI trench terminate the lateral edges of the DTI insulated control gate, a high voltage potential may be applied to the control gate, with respect to the floating gate storage section, before a breakdown occurs at these lateral edges. This voltage potential may be significantly higher than obtainable with control gates in conventional CMOS MTP cells. Among other benefits, the higher voltage permits forcing a higher Fowler-Nordheim tunnel current through a more insulating floating gate storage section insulating layer than can be obtained with prior CMOS MTP cells. Further, as will be apparent to persons of ordinary skill based upon this disclosure and upon practicing the embodiments, providing a higher programming voltage enables, for example, designs of the encapsulating structure, and other parameters of the floating gates that exhibit, or form a charge loss mechanism having a weaker electric field dependence and this, in turn may provide increased retention time, among the benefits and features of the MOS MTP cells according to the first embodiment.

In one example MOS MTP cell according to the first embodiment, an insulating protective layer is disposed over the floating gate. The insulating protective layer may be silicon protective (SIPROT) layer. A SIPROT layer may, for example, be formed by a conventional SIPROT layer process for forming a related art BiCMOS device.

Further, in one example MOS MTP cell according to the first embodiment, a sense gate first conductor element is formed on the substrate at a location proximal to, but not in electrical contact with, a first lateral edge of the floating gate sense section. The first conductor element may be a portion of, or may be connected to, a bit line. Likewise, a sense gate second conductor element may be formed on the substrate at a location proximal to a second lateral edge of the floating gate sense section. The second conductor element may be electrically connected to a sense switch that, in response to an externally generated MOS MTP cell read signal, selectively connects the sense gate second conductor element to an external second sense line. In one example, the external second sense line is a word line. As will be described in greater detail in later sections, the sense gate first conductor element, the sense gate second conductor element, and the bit line preferably have high impurity concentration, which must be of an appropriate types (i.e., are P+ or N+ type) corresponding to the type of well (N type or P type).

In one example MOS MTP cell according to the first embodiment, the floating gate sense section, the first and second lateral edge, and the first and second sense gate conductors are shaped and dimensioned so that, in response to a given charge stored on the floating gate, the floating gate sense section applies a field to a given channel region of the substrate under the floating gate sense section, to form a given conducting channel through the channel region.

Regarding specific shapes and dimensions, persons of ordinary skill in the art, by applying the know-how possessed by such persons to this entire disclosure, can readily determine acceptable materials, shapes, dimensions and arrangements of the first and second sense gate conductors to implement a BiCMOS system having MOS MTP cells according to the first embodiment, to meet given retention performance.

In one example MOS MTP cell according to the first embodiment, the sense switch is formed on, for example, the second surface well implant. In one example, the sense switch comprises a MOS FET, or equivalent, having a sense switch first conductor element, a sense switch second conductor element, and a sense switch control element.

In another example embodiment, at a designated MTP memory area of a BiCMOS substrate, a MOS MTP cell according to a second embodiment is formed. In one example MOS MTP cell according to the second embodiment, structure is included forming an example according to the first embodiment, combined with a protective polysilicon layer disposed on the SIPROT layer.

Among other features and benefits, the protective polysilicon layer of a MOS MTP cell according to the second embodiment may provide substantially higher shielding of the floating gate from external fields imposed by, for example, mobile charge.

Further among other features and benefits, the protective polysilicon layer may provide an additional capture of various contaminant species that may compromise integrity of the floating gate.

Further, according to one aspect, the protective polysilicon layer of a MOS MTP cell according to the second embodiment may be formed with the same process that forms a polysilicon contact on the base in the bipolar area. This polysilicon layer is generally known in the BiCMOS processing art as the "base poly."

In one example, at a designated MTP memory area of a BiCMOS substrate, a MOS MTP cell according to a third embodiment is formed. The MTP memory area is preferably, but not necessarily, within an area having a BN layer at a BN depth, such as a typical bipolar area of a typical BiCMOS substrate.

In one example according to the third embodiment, a deep trench isolation (DTI) trench forms a floating gate sense well above a portion of the buried BN layer. In one example, the floating gate sense well is a surface well implant. The DTI trench may, but does not necessarily, extend vertically to a depth greater than the BN depth, to form the floating gate sense well above a top surface of a portion of a buried BN layer. The floating gate sense well may be, but is not necessarily, an n-well.

In one example according to the third embodiment, a shallow-well isolation region is embedded into a top surface of the substrate, adjacent the floating gate sense well. The shallow-well isolation region may, but does not necessarily, have a top surface that is substantially co-planar with a top surface of the floating gate sense well.

In one example MOS MTP cell according to the third embodiment, a floating gate is formed having two sections displaced from another, but electrically connected to maintain the same voltage potential. In one example, the floating gate comprises a floating gate storage conductor formed on the shallow-well isolation region, and a floating gate sensing conductor formed on the floating gate sense well, with an insulating layer interposed between each of the floating gate conductors and their respective underlying surface.

One example of a programming of a MOS MTP cell according to the third embodiment applies a high voltage to the polysilicon control layer disposed on the floating gate top insulating layer, formed on the floating gate storage conductor. The voltage must be sufficient to establish a potential across the floating gate top insulating layer high enough to form a Fowler-Nordheim (FN) tunnel current through that insulating layer. The FN tunnel provides a charge flow between the polysilicon top control layer and the floating gate storage conductor. The direction, or polarity, of the programming voltage determines the direction of the current flow.

According to one aspect, the floating gate top insulating layer may be a SIPROT layer formed using, for example, a conventional SIPROT forming process.

Example MOS MTP cells according to the third embodiment provide various benefits. One benefit, provided in part by disposing the floating gate storage conductor on the shallow-well isolation region, is elimination of an active layer under the floating gate storage conductor, which significantly reduces charge leakage. This, in turn, offers still further increased retention.

Other of the various benefits of MOS MTP cells according to the third embodiment include, for example, a simplified structure and processing efficiency. For example, the base poly layer overlaying the SIPROT layer, in addition to being formable by a conventional base poly process, performs at least three functions; protection of the floating gate against external fields, protection of the floating gate against contaminants, and operation as a control gate for programming the MOS MTP cell.

Each of these various embodiments provides MOS MTP cells having a novel structure, providing various substantial benefits including, for example, substantially improved data retention and significantly higher density than available with conventional MOS MTP cells formed with CMOS processing steps in the related art CMOS systems.

Further, each of these various embodiments provides methods for forming MOS MTP cells according to one or more of the embodiments, each of the various methods comprising bipolar processing steps performed in forming bipolar devices in the bipolar region, combined with CMOS processing steps performed in forming CMOS devices in the CMOS region. The requirement for steps unique to the MTP cells, particularly to form high density and high retention MTP cells, is therefore very significantly reduced, if not eliminated.

FIG. 1 shows a schematic cross-section of exemplary portions of one BiCMOS MTP system 10, according to the first embodiment. Referring to FIG. 1, a substrate 12 supports bipolar devices, with one illustrative example depicted as bipolar device 14 and, at locations laterally displaced from the bipolar devices such as 14, a plurality of complementary metal oxide (CMOS) MTP cells such as the one depicted exemplary MTP cell 16.

Regarding the bipolar devices such the depicted example 14, the specific structure and function(s) of the bipolar devices are not particular to the practice of the embodiment. The example bipolar device 14 is merely an illustrative example of a bipolar device that may be formed in a conventional BiCMOS system, using conventional BiCMOS fabrication steps. As will be described in greater detail at later sections, one among the various features of the present invention is that the CMOS MTP cells, such as the example 16, may be formed using conventional BiCMOS fabrication steps without requiring additional steps.

With continuing reference to FIG. 1, the illustrative example MTP cell 16 of the example BiCMOS MTP system 10 includes a first DTI trench 18.

The term "DTI trench" as used in this description includes a shallow trench isolation (STI) base portion (not separately labeled) and a deeper extending portion (not separately labeled), having a smaller width than the STI base portion. This is a known DTI trench profile, and the relative proportions and dimensions of the STI base and deeper extending portion are readily determinable by persons of ordinary skill in the art based on the present disclosure.

Figure 2:
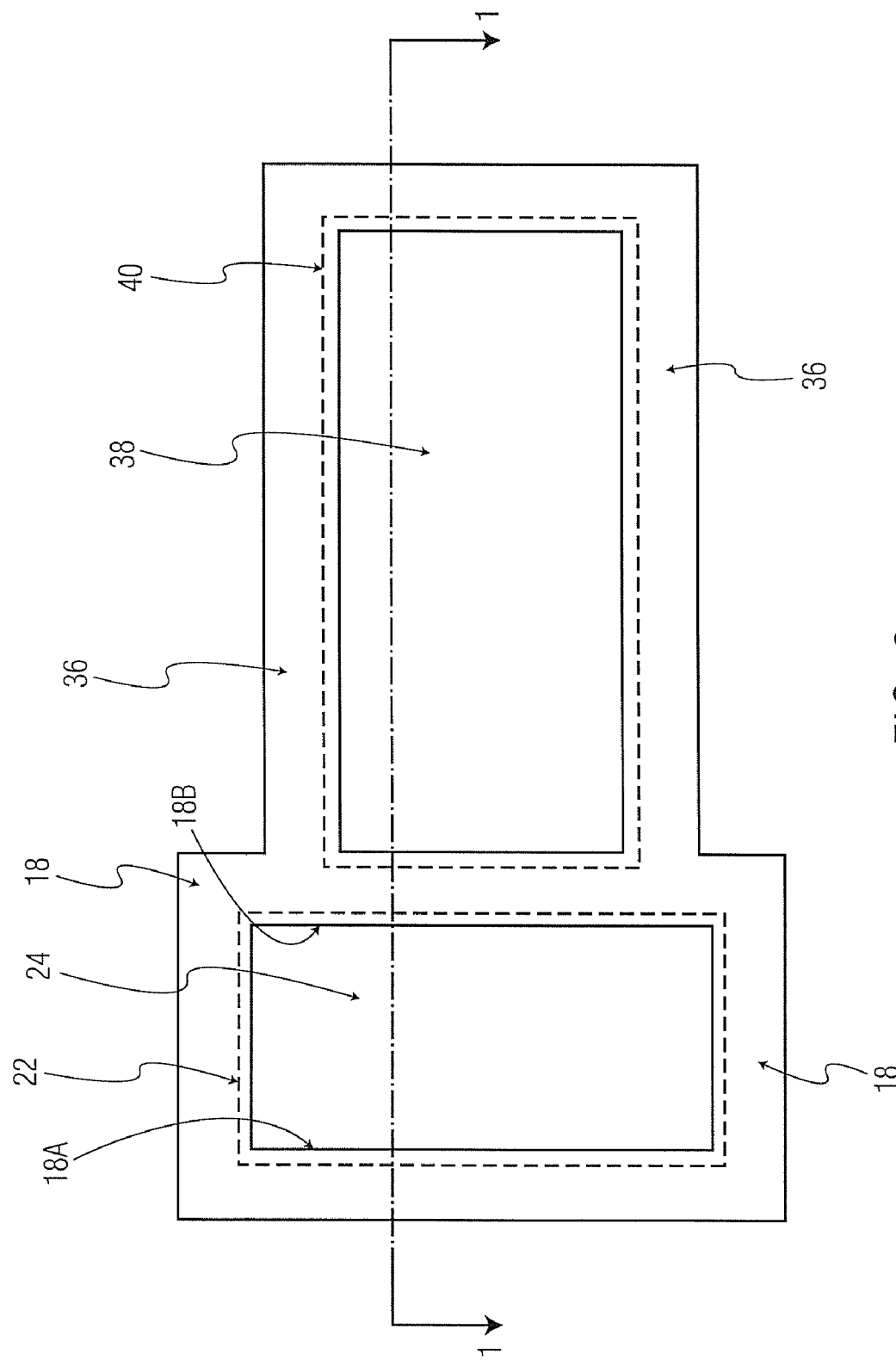
FIG. 2 shows an example simplified top view layout illustrating one example layout for implementing one example of a MOS MTP cell according to a first embodiment.

FIG. 2 shows a top projection view of relevant structures of one example MTP cell 16 and, referring to FIG. 2, reference character 18 labels one example arrangement of the first DTI trench 18 as seen in cross-section at FIG. 1. The projection reference line 1-1 at FIG. 2 shows a cut line from which the FIG. 1 cross-section is viewed. As seen in FIG. 1, the first DTI trench 18 has inward oriented faces appearing in cross section as 18A and 18B.

Referring to FIGS. 1 and 2, the first DTI trench 18, including its sections 18A and 18B, extends a depth D1 from a top surface 12A of the substrate 12 down into a pre-formed first BN layer to form a first buried well implant 22 having the perimeter shown at FIG. 2 and, referring to FIG. 1, a thickness T1 and a top surface 22A at a depth D2 under the top surface (not numbered) of the substrate 12. As seen at FIG. 1, the first buried well implant 22 extends horizontally to the inner walls of the first DTI trench 18, as shown at surfaces 18A and 18B.

Referring again to FIG. 1, the inward face of the first DTI trench 18, such as shown as 18A and 18B in the depicted cross section, bound a first surface well implant, labeled generally as region 24. The first surface well implant 24 is not necessarily a different doping than the substrate 12 and may, for example, be an N region.

As will be understood by persons of ordinary skill in the art in view of the remaining structure of FIG. 1, which is described in greater detail in later sections, by applying sufficient voltage to the stacked arrangement of the first buried well implant 22 and overlaying first surface well implant 24 relative to the floating gate sections 30 and 32, the structures 22 and 24 function as a control gate, providing for programming/erasing of the floating gates. The term "DTI insulated control gate 22, 24" therefore refers to the collective structure of the first buried well implant 22 and the first surface well implant 24.

A primary function of the DTI trench 18 is providing, by the abutment (not separately labeled) of its inward faces 18A and 18B as seen in the FIG. 1 cross-section, provides, among other benefits, a higher breakdown voltage of the DTI insulated control gate 22, 24 with respect to the substrate 12 than obtainable with prior art CMOS MTP cells. As described previously hereinabove, the breakdown voltage is provided, in part, by this first DTI trench 18 removing the cylindrical diffusion portion of the BN-to-substrate blocking junction at the interface of the lateral walls of the first surface well implant 24 and the surrounding substrate 12 that would exist absent the vertical walls of the first DTI trench being interposed. Based on these and other disclosed mechanisms of operation, persons of ordinary skill in the art, by applying the know-how such persons possess to this disclosure, can readily identify numeric values for D1, and all other dimensions of the first DTI trench 18.

Referring again to FIG. 1, a dielectric insulating layer 28A such as, for example, an oxide, is disposed on the top surface (not numbered) of the first well region 24. A floating gate storage conductor 30 consisting of, for example, a polysilicon layer, is disposed on the dielectric insulating layer 28A. Adjacent to the floating gate storage plate section 30, outside of the first carrier well region 24, a floating gate sensing conductor 32 is disposed on another dielectric insulating layer 28B. The floating gate sensing conductor 32 may be formed, for example, of a polysilicon.

Referring to FIGS. 1 and 2, a second DTI trench 36 which may, as depicted in the example, have a section that is common with the first DTI trench 18, extends a depth from a top surface of the substrate 12 down into a pre-formed BN layer to form a second surface well implant 38 above a second buried BN well implant 40. The BN layer from which the second buried BN well implant 40 is formed may be, but is not necessarily, the same as the BN layer from which the first buried implant well 22 of the DTI insulated control gate 22, 24 is formed. The second DTI trench 36, at sections not common with the first DTI trench 18, may be, but is not necessarily, formed with same profile as the first DTI trench 18.

FIG. 2 shows a polysilicon layer 31 forming an electrical connection formed between the floating gate storage conductor 30 and the floating gate sensing conductor 32. The layer 31 is not visible in FIG. 1 because of the location of the cross-section 1-1. The collective structure of the floating gate storage conductor 30 and the floating gate sensing conductor 32 are referenced in this description as the "floating gate."

With continuing reference to FIG. 2, preferably the surface area of the floating gate storage conductor 30, and the surface area of the DTI insulated control gate 22, 24 are large, and these respective areas are substantially aligned and substantially equal, to provide good capacitive coupling when programming the MTP.

Referring to FIG. 1, a silicon protection (SIPROT) layer 33 may be formed over the floating gate storage conductor 30 and the floating gate sensing conductor 32. The SIPROT layer 33 may, or example, be an alternating oxide layer and nitride layer. The SIPROT layer 33 may be formed by a conventional SIPROT process used in fabrication of typical devices in related art BiCMOS systems. The functions of the SIPROT layer 33 include insulation, i.e., encapsulation, of the floating gate elements, in addition to physical protection of these elements.

As described in greater detail in later sections, the floating gate must store a sufficient amount of charge to provide a given read accuracy, over given operating conditions, over a given minimum retention time. Therefore, there is no electrical conductor connecting sections 30 and 32 to anything except each other. The insulating layer 28A therefore must prevent leakage from the floating gate storage conductor 30 to the underlying first carrier well 24, and the insulating layer 28B must prevent leakage from the floating gate sense conductor 32 to the underlying second carrier well 38. Further to this objective, the surface well implant 38 is preferably n-type, which is the body diffusion of a PMOS transistor Notwithstanding the insulating structure, though, physics dictate that some charge will migrate, for example through the insulating layers 28A and 28B, and through other encapsulating layers (described in greater detail in later sections) contacting the floating gate. However, referring to FIG. 1, persons of ordinary skill in the art, applying the know-how such persons possess to the present disclosure, can readily select materials and dimensions meet a given retention and programmability specification.

As illustrative examples regarding thickness of the insulating layers 28A and 28B, relevant factors identifiable from this description by persons of ordinary skill in the art include the retention time, the capacitance (charge storing capacity) of the floating gate conducting elements, the necessary function of the floating gate sense conductor as a transistor gate (controlling a channel through the underlying second surface well implant 38), and the voltage required to create an FN tunnel current through the gate oxide (i.e., layer 28A). One example thickness meeting these requirements is an insulating layer that is greater than or equal to approximately 75 angstroms.

The materials constituting layers 28A and 28B may be, but are not necessarily, identical. Likewise, the thicknesses of the layers 28A and 28B may be, but are not necessarily, the same value.

Referring again to FIG. 1, an access switch such as, for example, an access transistor 42 is formed over the second carrier well 38. In the FIG. 1 example, the access transistor 42 has a gate 42G formed over an insulating layer 28C, a source 42S and a drain 42D. As can be readily seen by a person of ordinary skill in the art, the impurity type of which the source 42S and drain 42D are formed depends on the impurity type of the second surface well implant 38. The access transistor 42 may be formed using conventional CMOS processing steps such as used in related art BiCMOS systems. The insulating layer 28C may be, but is not necessarily, formed at the same processing step(s) as insulating layer 28A under the floating gate storage conductor 30, and insulating layer 28B under the floating gate sensing conductor 32.

Referring still to FIG. 1, a first reading signal line, such as the example word line 44 may be formed on the substrate, connected to one terminal of a sensing switch, such as source 42S of the access transistor 42. A second terminal of a sensing switch, such as the drain 42D of the access transistor 42, may be connected via, for example, a polysilicon trace such as 46, to a first conducting element proximal to one edge of the floating gate sensing conductor, such as the conducting element 48 proximal to one edge (not numbered) of the floating gate sensing conductor 32. A second reading signal line, such as the example bit line 50, may be formed proximal to, or be connected to a conductor that is proximal another edge of the floating gate sensing conductor 32, as illustrated by the depicted section of the bit line 50 that is proximal to another edge (not numbered) of the floating gate sensing conductor 32. As will be understood by persons of ordinary skill in the art, if an MTP according to FIG. 1 is an "PMOS MTP" architecture, the well implant under the sensing switch is an N-type well implant which, in this example, means the second surface well implant 38 under the transistor 42 is N-type. Therefore, in such an example, the source and drain of the transistor, namely 42A and 42G, the bit line, namely 50, and the conductor 46 must all be p-type diffusions.

As readily apparent to persons of ordinary skill in the art, since the floating gate storage conductor 30 and the floating gate sensing conductor 32 are electrically connected, a given charge on the floating gate storage conductor 30, at a given potential, places the floating gate sensing conductor 32 at the potential. As also readily apparent, the relation between the polarity of the charge and the creation, or elimination, of a current channel through the second surface well implant 38 between the word line 44 and the bit line 50 depends on whether the second surface well implant 38 is an n-type or p-type region. Assuming the second surface well implant 38 is N type, positive charge on the floating gate sensing conductor 32 establishes the channel. Likewise, a positive signal on the gate 42G of the accessing transistor 36 forms a conducting channel between the source 42S and the drain 42D. Therefore, the access transistor 42 and the floating gate sensing conductor 32 form a logical AND operation, establishing a path from the bit line to the word line 44 only (assuming a positive charge is a "1," only if the reading signal to the gate 42G and the charge on the floating gate sensing conductor are both a "1."

Programming a MOS MTP cell having a DTI insulated control gate, such as the example 22, 24 bounded by the DTI 18 as shown in FIG. 1, may be substantially the same as programming a prior art CMOS MTP cell except that, for reasons described hereinabove, the programming may apply a substantially higher voltage to a control gate arranged and structured as the example DTI insulated control gate 22, 24.

As one illustrative example, in a BiCMOS system having CMOS logic operating voltages of approximately 3 volts, embodiments as depicted at FIG. 1 are contemplated as employing programming voltages including, but not limited to approximately 11 to 12 volts.

Figure 3:
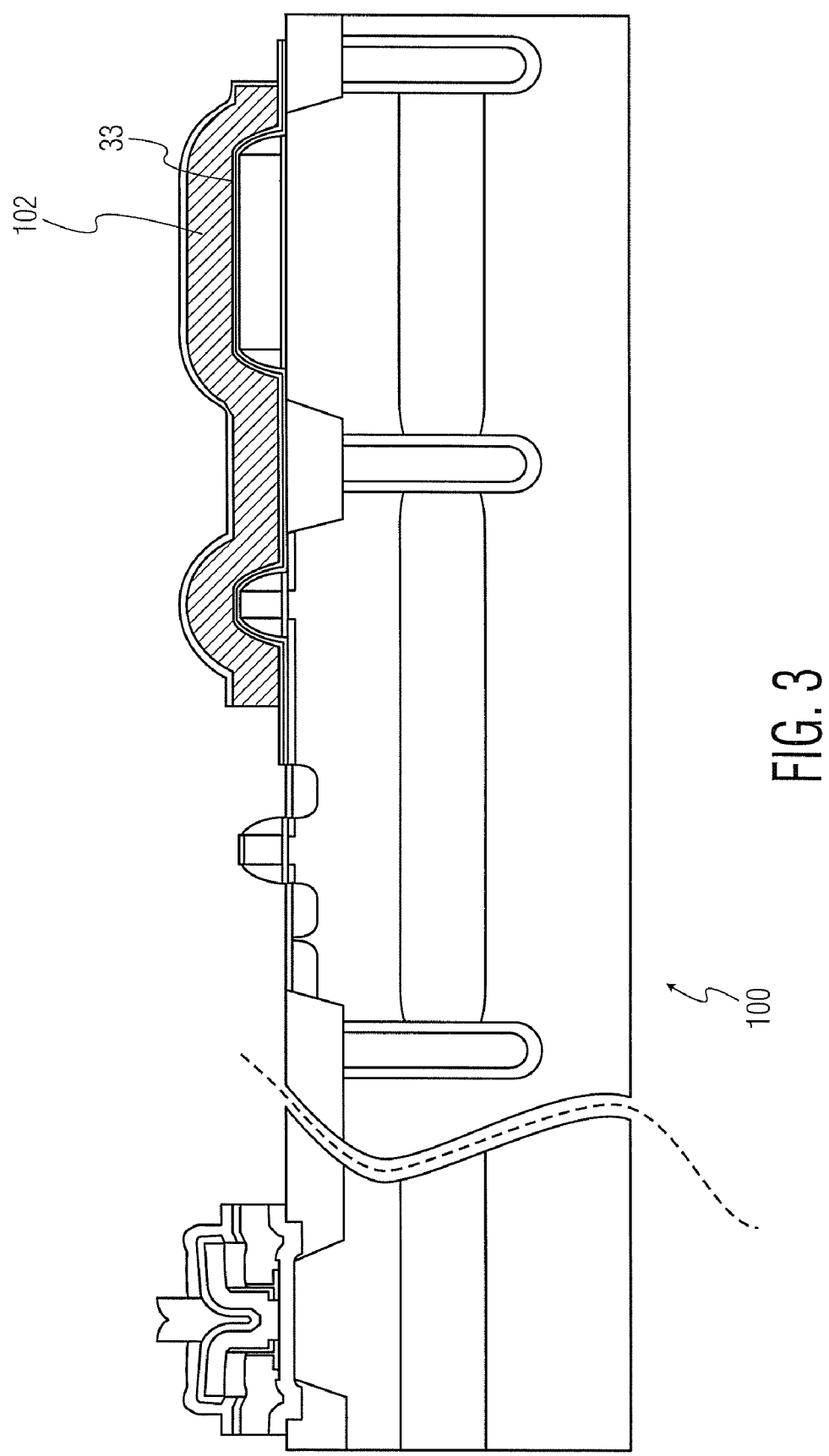
FIG. 3 shows a schematic cross-section of one example BiCMOS system having one example MOS MTP cell having a polysilicon protective layer overlaying a floating gate, according to a second embodiment.

FIG. 3 shows a schematic cross-section of one example BiCMOS system having a MOS MTP cell 100, illustrating another embodiment having, in an example combination, a protective polysilicon layer 102 overlaying a protective insulating layer such as, for example, the SIPROT layer 33 described in reference to FIG. 1. The protective polysilicon layer 102 may be the same structure as a conventional base poly layer used in vertical bipolar devices having buried collectors. Except for the protective polysilicon layer 102, the FIG. 3 example MOS MTP cell 100 may be substantially identical to the FIGS. 1 and 2 example MOS MTO cell 16.

Among other features and benefits, a protective polysilicon layer such as 102, combined in a MOS MTP cell structure as the FIG. 3 example 100 may provide substantially higher shielding of the floating gate (i.e., items 30 and 32) from external fields imposed by, for example, mobile charge.

Further among other features and benefits the protective polysilicon layer such as 102 may provide an additional capture function with respect to various contaminant species that may compromise integrity of the floating gate.

Further, according to one aspect, a protective polysilicon layer such as 102, combined in a MOS MTP cell structure as the FIG. 3 example 100, may be formed with the same process that forms a polysilicon contact (base poly) on a base in the bipolar area.

Figure 4:
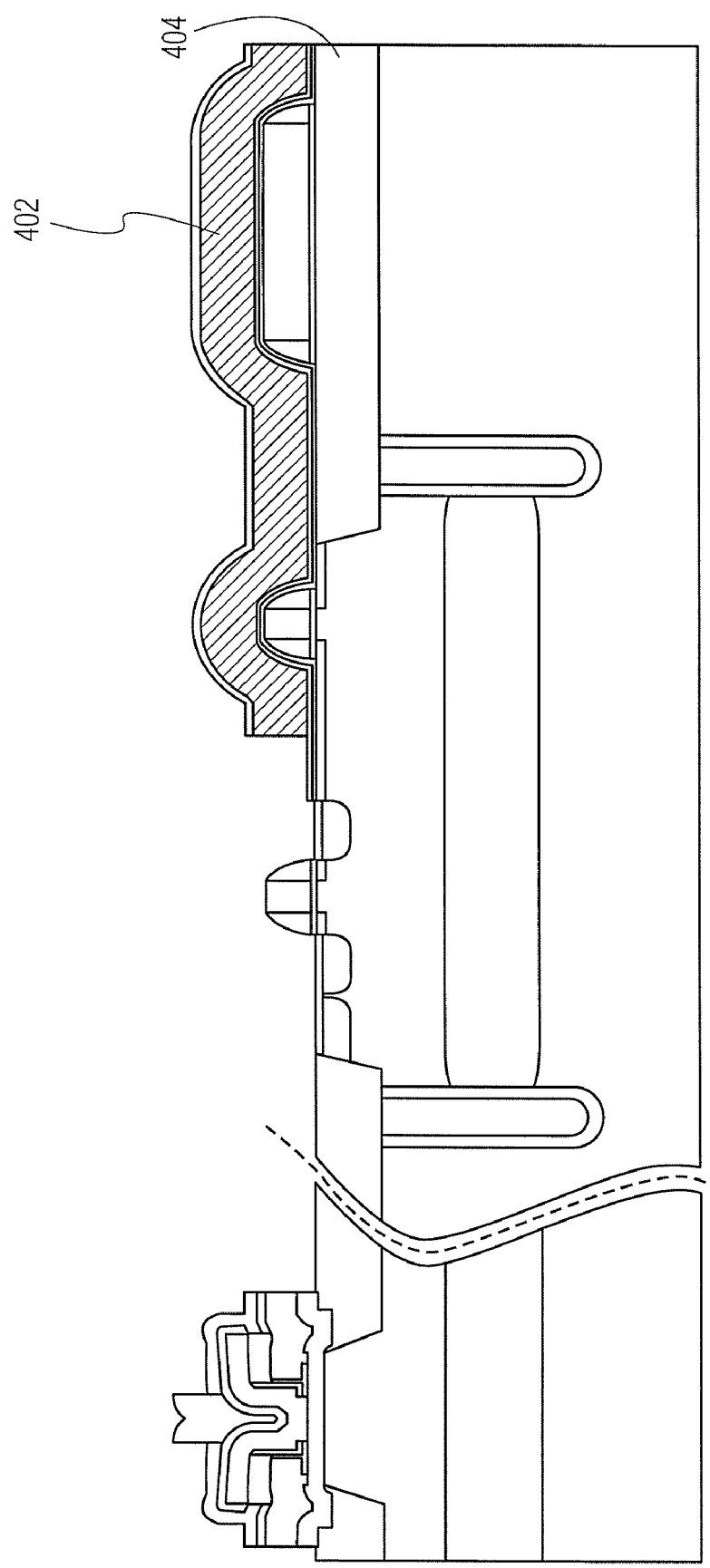
FIG. 4 shows a schematic cross-section of one example BiCMOS system having one example MOS MTP having a control gate disposed over a floating gate, and a base poly layer under the floating gate, according to another embodiment.

FIG. 4 shows a schematic cross-section of one example BiCMOS system MTP cell 400 illustrating another embodiment having, in an example combination, one example overlaying control gate 402 in an example merged arrangement with a poly layer such as, for example, the protective polysilicon layer 102 of FIG. 3. The depicted example 402 may be structural identical to the FIG. 3 later 102, the different numbering is only for purposes of referencing the merged function achieved in the FIG. 4 example.

Referring to FIG. 4, the merged control gate 402 is formed over an insulating layer such as, for example, SIPROT layer 33.

The FIG. 4 arrangement of the merged control gate 402 formed over a top insulating layer such as, for example, SIPROT layer 33, selectively programs the floating gate by forcing an FN tunnel current through the top insulating layer, e.g. the SIPROT layer 33. The direction or polarity of the programming voltage determines the direction of the current flow. When the voltage is removed, the FN tunnel ceases and, since the floating gate storage conductor 30 and sensing conductor 32 are otherwise insulated from any external structure, the charge effected by the FN tunnel remains. This programming differs substantially from using a buried control gate forcing an FN tunnel current through a bottom insulating layer, such as performed by the buried control gate 22 of the embodiments shown at FIGS. 1, 2 and 3 in forcing an FN tunnel current through layer 28A.

One feature of this programming provided by the overlaying control gate such as 402, with interspersed insulating top layer such as the SIPROT layer 33, is that the control gate well implants, such as the buried well implant 22 and overlaying surface well implant 38 of FIGS. 1, 2 and 3, can be eliminated.

Referring to FIG. 4, in one example, instead of a surface well implant under the floating gate conductor 32, a shallow-well isolation region, such as the example 404, is formed at an upper region of the substrate 12. Insulating layer 28A may be retained.

As readily apparent to persons of ordinary skill in the art from FIG. 4, various benefits are obtained from structures according to this embodiment. One such benefit is that the elimination of the active layer, e.g., a surface well implant such as the first surface well implant 24, under the floating gate storage conductor, e.g., the floating gate storage conductor 30, which significantly reduces charge leakage through the insulating layer 28A. This, in turn, may provide even further increased retention.

The thickness and the constituent material of the insulating layer, e.g., the SIPROT layer 33, for this embodiment to perform the merged control gate and protective layer function, is readily determined by persons of ordinary skill in the art, applying the know-how such persons possess to the present disclosure. For illustrative example, a SIPROT top layer such as 33, formed of, for example, alternating oxide and nitride, having a total thickness of approximately 40 nanometers may be considered as one nominal value.

The sensing modes for detecting a charge, or absence of charge on the floating gate, for all of the particular examples according to various embodiments, are described in reference to using an access switch, such as the access transistor 42. This method of detecting a charge state of the floating gate is only one example. Further, whatever means or method used to detect the charge state is not contemplated as being particular to the invention. Various alternatives will be apparent to persons of ordinary skill in the art based on this disclosure, and further alternatives may become apparent through practicing the embodiments. For example, the FIG. 1 access transistor 42 may be replaced by other transistor types and configurations such as, for illustrative example, extended drain MOS devices, bipolar transistors, and diodes.

Applications for BiCMOS systems, methods, and MOS MTP memory cells implementing one or more of the various embodiments span a very large scope of technologies, functions and products. Illustrative examples include random access memory for storing software, protocols, and algorithms. Other examples include sets of digital registers storing, for example, user, application or customer specific customizations. Registers implemented according to the present embodiments may store die ID or other supply chain-related information. Registers implemented according to the present embodiments may store die ID or other register information that controls, for example, a switch-bank for electronic trimming of analog and RF functions.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention.

Accordingly, the foregoing disclosure, description, and figures are for illustrative purposes only and do not in any way limit the invention, which is defined only by the claims.

We hereby claim:

1. A BiCMOS system comprising:
a semiconductor substrate comprising:
   a CMOS area supporting at least one CMOS device, and
   a bipolar area supporting at least one bipolar device; and
a many times programmable (MTP) cell, comprising:
   a deep trench isolation (DTI) isolated control gate comprising:
      a first surface well implant within said semiconductor substrate, bounded by inward facing surfaces of a first DTI trench surrounding a given region of the semiconductor substrate, the first DTI trench extending vertically a depth D1 into an upper surface of the semiconductor substrate,
      a first buried well implant under the first surface well implant, said first buried well implant extending at a depth less than D1 and having a perimeter abutting the inward facing surfaces of the first DTI trench, wherein a doping level of the first surface well implant is lower than a doping level of the first buried well implant,
      a first floating gate disposed on an upper surface of said first surface well implant, and
      a second floating gate, electrically connected to the first floating gate, disposed on an area of the upper surface of the semiconductor substrate outside said upper surface of said first surface well implant, wherein said first floating gate and said second floating gate are arranged and dimensioned to selectively form a channel through the substrate, in response to a given charge state on the first and second floating gates.

2. The BiCMOS system of claim 1, wherein the MTP cell further comprises:
a second surface well implant within said semiconductor substrate, adjacent said first surface well implant, formed by a second DTI trench, wherein the second floating gate is disposed on an upper surface of the second surface well implant, and wherein the first floating gate and the second floating gate are arranged and dimensioned to selectively form the channel through the second surface well implant.

3. The BiCMOS system of claim 2, wherein the second DTI trench has a section common with the first DTI trench.

4. The BiCMOS system of claim 3, wherein the second DTI trench includes inward facing surfaces and the second surface well implant is further formed by a top surface of a buried implant layer having a perimeter abutting the inward facing surfaces of the second DTI trench.

5. The BiCMOS system of claim 1, further comprising:
an insulating protective layer disposed on a top surface of the first floating gate.

6. The BiCMOS system of claim 5, further comprising:
a polysilicon protective layer disposed on the insulating protective layer.

7. The BiCMOS system of claim 6, wherein the insulating protective layer comprises a silicon protective (SIPROT) layer.

8. The BiCMOS system of claim 5, wherein the insulating protective layer comprises a silicon protective (SIPROT) layer.

9. The BiCMOS system of claim 1, wherein the MTP cell further comprises:
   a first signal line disposed on the semiconductor substrate, electrically connected to a position at one end of said channel; and
   a controllable sense switch to selectively connect a position at another end of said channel to a second signal line.

10. The BiCMOS system of claim 1, wherein the first DTI trench removes a cylindrical diffusion portion of a block junction at an interface of lateral walls of the first surface well implant and the semiconductor substrate.

11. The BiCMOS system of claim 1, wherein an operating voltage is approximately 3 volts.

12. The BiCMOS system of claim 1, wherein a programming voltage is approximately 11 to 12 volts.

13. A BiCMOS system comprising:
   a semiconductor substrate having a CMOS area supporting at least one CMOS device and a bipolar area supporting at least one bipolar device; and
   a many times programmable (MTP) cell, comprising:
      a surface well implant within said semiconductor substrate, formed by inward facing surfaces of a deep trench isolation (DTI) trench surrounding a given region of the semiconductor substrate,
      a shallow isolation well, adjacent said surface well implant, having an upper surface at an upper surface of the semiconductor substrate,
      a first floating gate disposed on the upper surface of said shallow isolation well,
      a second floating gate, electrically connected to the first floating gate, disposed on an area of the upper surface of the surface well implant, and
      a control gate disposed on a top surface of the first floating gate, wherein said first floating gate and said second floating gate are arranged and dimensioned to selectively form a channel through the surface well implant in response to a given charge state on the first and second floating gates.

14. The BiCMOS system of claim 13, wherein the first floating gate comprises:
   a bottom insulating layer disposed on the upper surface of said shallow isolation well;
   a first floating gate conductor layer disposed on said bottom insulating layer; and
   a top insulating layer disposed on a top surface of said first floating gate.

15. The BiCMOS system of claim 14, wherein the top insulating layer comprises a silicon protective (SIPROT) layer.

16. The BiCMOS system of claim 15, wherein the control gate comprises a polysilicon layer disposed above the SIPROT layer.

17. The BiCMOS system of claim 14, wherein said control gate and said first floating gate are arranged and dimensioned to selectively form, in response to a given external voltage applied to the control gate with respect to the first floating gate conductor layer, a Fowler-Nordheim (FN) tunnel current through the top insulating layer to selectively charge and discharge said first floating gate and said second floating gate.

* * * * *